US012803515B2

(12) United States Patent
Szilagyi et al.

(10) Patent No.: US 12,803,515 B2
(45) Date of Patent: Nov. 17, 2026

(54) CIRCUIT AND METHOD FOR MEASURING AND CORRECTING SIGNAL OFFSET AT TWO POINTS

(71) Applicant: GlobalFoundries Dresden Module One Limited Liability Company & Co. KG, Dresden (DE)

(72) Inventors: Laszlo Szilagyi, Dresden (DE); Stefan Manolov Stefanov, Sofia (BG); Torsten Gross, Dresden (DE)

(73) Assignee: GlobalFoundries Dresden Module One Limited Liability Company & Co. KG, Dresden (DE)

( * ) Notice: Subject to any disclaimer, the term of this patent is extended or adjusted under 35 U.S.C. 154(b) by 629 days.

(21) Appl. No.: 18/154,170

(22) Filed: Jan. 13, 2023

(65) Prior Publication Data

US 2024/0243713 A1 Jul. 18, 2024

(51) Int. Cl.

*H03F 3/45* (2006.01)
*H03F 1/26* (2006.01)
(Continued)

(52) U.S. Cl.

CPC ........... *H03F 3/45475* (2013.01); *H03F 1/26* (2013.01); *H03F 3/087* (2013.01);
(Continued)

(58) Field of Classification Search

CPC ........ H03F 3/45475; H03F 1/26; H03F 3/087; H03F 3/45973; H03F 2200/168;
(Continued)

(56) References Cited

U.S. PATENT DOCUMENTS 7,368,999 B2 5/2008 Natzke
9,819,421 B1 11/2017 Xie et al.
(Continued)

FOREIGN PATENT DOCUMENTS

CN 115549610 A * 12/2022 ............... H03F 1/34

OTHER PUBLICATIONS

Chen, Kuan-Chang; "A25-GB/s Avalanche Photodector-Based Burst-Mode Optical Receiver with 2.24-ns Reconfiguration Time in 28-nm CMOS"; IEEE Journal of Solid-State Circuits; vol. 54; No. 6; Jun. 2019; pp. 12.
(Continued)

*Primary Examiner* — Andrea Lindgren Baltzell
*Assistant Examiner* — Lance Torbjorn Bartol
(74) *Attorney, Agent, or Firm* — Ramakrishnan Parthasarathy; Hoffman Warnick LLC

(57) ABSTRACT

A circuit structure including: a first amplifier stage having an input, and a second amplifier stage connected to the first amplifier stage. The second amplifier stage has an output. The first amplifier stage and the second amplifier stage carry a signal. A controller is configured to measure and modify at least one operational parameter of the signal. A first offset polarity detector-low pass filter (OPD-LPF) circuit connects the second amplifier stage output to the controller through a first controller input. A second OPD-LPF circuit connects the second amplifier stage to the controller through a second controller input. The controller measures an operational parameter of the signal for offset based on input from the first OPD-LPF circuit and the second OPD-LPF circuit. The controller modifies the operational parameter of the signal to correct signal offset.

19 Claims, 9 Drawing Sheets

(51) Int. Cl.
*H03F 3/08* (2006.01)
*H03F 3/68* (2006.01)
*H04B 10/69* (2013.01)

(52) U.S. Cl.
CPC ........... *H03F 3/45973* (2013.01); *H03F 3/68* (2013.01); *H04B 10/6933* (2013.01); *H03F 2200/168* (2013.01); *H03F 2200/375* (2013.01); *H03F 2203/45138* (2013.01)

(58) Field of Classification Search
CPC ..... H03F 2200/375; H03F 2203/45138; H03F 3/68; H04B 10/6933
USPC .............................................................. 330/9
See application file for complete search history.

(56) References Cited

U.S. PATENT DOCUMENTS

| | | | | |
|---|---|---|---|---|
| 10,313,021 | B1 | 6/2019 | Frankel et al. | |
| 10,797,658 | B1 | 10/2020 | Raj | |
| 2004/0157573 | A1 | 8/2004 | Lee et al. | |
| 2012/0249241 | A1 | 10/2012 | Moto et al. | |
| 2013/0342275 | A1 | 12/2013 | Takemoto et al. | |
| 2014/0117212 | A1 | 5/2014 | Imai et al. | |
| 2015/0372648 | A1 | 12/2015 | Sugimoto | |
| 2016/0226458 | A1* | 8/2016 | Frank .................. | H03F 3/45475 |
| 2016/0285563 | A1* | 9/2016 | Tanaka ................ | H03F 3/45475 |
| 2016/0308566 | A1 | 10/2016 | Chang et al. | |
| 2019/0173588 | A1 | 6/2019 | Ahmed et al. | |

OTHER PUBLICATIONS

Li, Hao et al.; "A 100Gb/s-8.3dBm-Sensitivity PAM-4 Optical Receiver with Integrated TIA, FFE and Direct-Feedback DFE in 28nm CMOS"; IEEE International Solid-State Circuits Conference; Advanced Wireline Links and Techniques; SSCC 2021; Session 11; pp. 3.

Rylyakov, Alexander et al.; A 25 GB/s Burst-Mode Receiver for Low Latency Photonic Switch Networks; IEEE Journal of Solid-State Circuits; vol. 50; No. 12; Dec. 2015; pp. 13.

Szilagyi, Laszlo et al.; "A 53-Gbit/s Optical Receiver Frontend With 0.65 pJ/bit in 28-nm Bulk-CMOS"; IEEE Journal of Solid-State Circuits; vol. 54; No. 3; Mar. 2019; p. 11.

Szilagyi, Laszlo et al.; "A Mixed-Signal Offset-Compensation System for Multi-Gbit/s Optical Receiver Frontends"; IEEE 27th International Conference on Very Large Scale Integration; 2019 IFIP; pp. 6.

Szilagyi, Laszlo et al.; "Area-Efficient Offset Compensation and Common-mode Control Circuit with Switched-Capacitor Technique in an 18 Gbps Optical Receiver in 80 nm CMOS"; IEEE Xplore; 2015.

Szilagyi, Laszlo et al.; "Offset-Compensation Systems for Multi-Gbit/s Optical Receivers"; IFIP International Federation for Information Processing 2020; Published by Springer Nature Switzerland AG 2020; pp. 21.

European Search Report for corresponding EP Application No. 23195916.4-1205 dated Feb. 26, 2024, 11 pages.

Zheng et al., "A CMOS VGA With DC Offset Cancellation for Direct-Conversion Receivers," IEEE Transactions on Circuits and Systems—I.: Regular Papers, vol. 56, No. 1, Jan. 2009, pp. 103-113.

* cited by examiner

CIRCUIT AND METHOD FOR MEASURING AND CORRECTING SIGNAL OFFSET AT TWO POINTS

TECHNICAL FIELD

Embodiments of the disclosure relate generally to offset correction in circuits. More specifically, the disclosure relates to offset detection and correction in signals in optical or opto-electronic circuits at two or more points therein.

BACKGROUND

Silicon photonic integrated circuits (PICs) use electromagnetic energy, i.e., photons, to transmit information through data signals at various wavelengths in the electromagnetic spectrum. Accordingly, PICs have a multitude of applications in modern computing and data communications. PICs have advantages over electronic circuits because they can offer higher speed data transmission, greater bandwidth, better thermal properties, and higher signal fidelity. Despite these advantages, PICs often suffer from similar signal corruption problems faced by electronic circuits. One such issue is offset, which alters the signal within a circuit, thereby corrupting the transmitted information. Some causes of offset within a circuit are variations between circuit components introduced during fabrication, temperature variation within the circuit, and input optical power changes. These can also cause dynamic offset in the common mode voltage across various points in opto-electronic receiver circuits. Moreover, gain in a circuit (caused by, e.g., operational amplifiers) can amplify offset to a level that destroys the signal.

SUMMARY

One aspect of the disclosure includes a circuit structure, comprising: a first amplifier stage having an input; a second amplifier stage connected to the first amplifier stage, the second amplifier stage having an output, wherein the first amplifier stage and the second amplifier stage carry a signal; a controller configured to measure and modify at least one operational parameter of the signal, the controller including: a first controller input, a first controller output connecting the controller to the input; and a second controller input; a first offset polarity detector-low pass filter (OPD-LPF) circuit connecting the second amplifier stage output to the controller through the first controller input; and a second OPD-LPF circuit connecting the second amplifier stage to the controller through the second controller input; wherein the controller measures the at least one operational parameter of the signal for offset based on input from the first OPD-LPF circuit and the second OPD-LPF circuit, and wherein the controller modifies the at least one operational parameter of the signal to correct signal offset through the first controller output.

Another aspect of the disclosure includes a silicon photonic receiver circuit, comprising: a single-ended amplifier stage; a photodiode configured to feed a signal to the single-ended amplifier stage; a differential amplifier stage receiving input from the single-ended amplifier stage; a controller configured to measure and modify at least one operational parameter of the signal, the controller including: a first controller input, and a second controller input; a first offset polarity detector-low pass filter (OPD-LPF) circuit connecting an output of the differential amplifier stage to the controller through the first controller input; and a second OPD-LPF circuit connecting the differential amplifier stage to the controller through the second controller input; wherein the controller measures the at least one operational parameter of the signal for offset based on input from the first OPD-LPF circuit and the second OPD-LPF circuit, and wherein the controller modifies the at least one operational parameter of the signal to correct signal offset.

Another aspect of the disclosure includes a method for correcting offset in a signal, the method comprising: calibrating a signal carried by a circuit by: measuring at least one operational parameter of the signal with a controller, the controller configured to measure the at least one operational parameter of the signal through a first offset polarity detector-low pass filter (OPD-LPF) circuit connecting the controller to the circuit, and calibrating the signal with the controller by modifying the at least one operational parameter of the signal at an input of the circuit in a first feedback loop; and tracking the signal by: measuring the at least one operational parameter of the signal at an output of the circuit, the controller measuring the signal through a second OPD-LPF circuit.

BRIEF DESCRIPTION OF THE DRAWINGS

The embodiments of this disclosure will be described in detail, with reference to the following figures, wherein like designations denote like elements, and wherein.

Figure 1A:
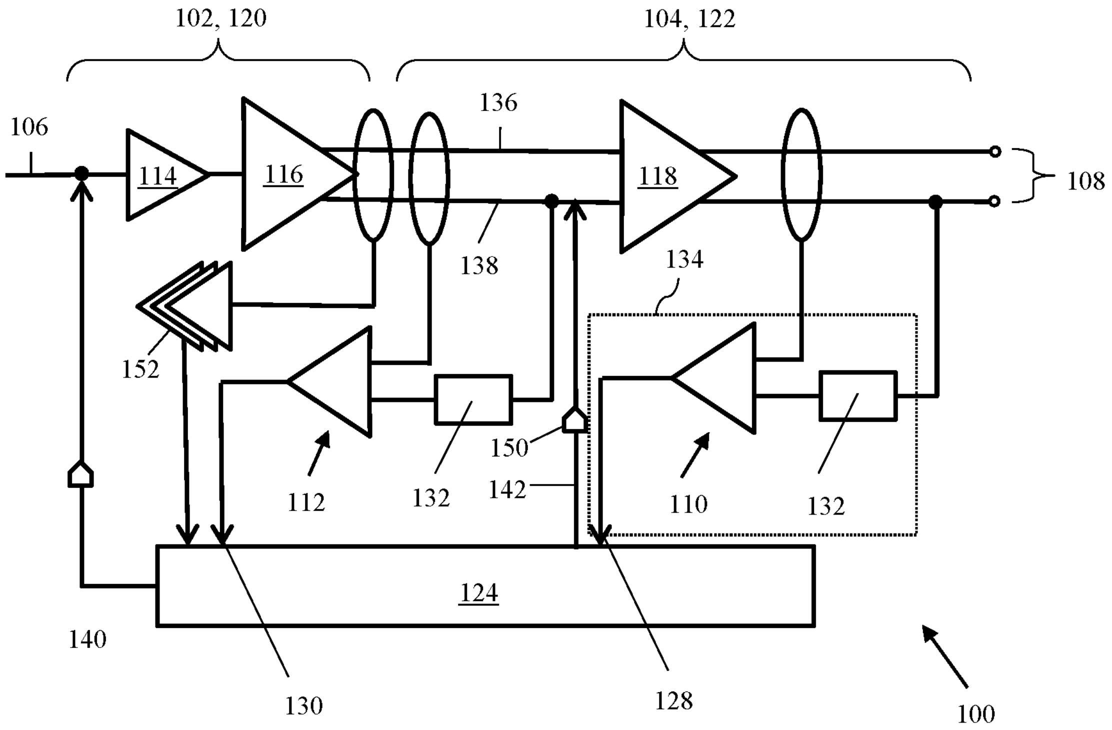
FIG. 1A shows a schematic view of a circuit structure with offset detection at two points and offset correction at one point, according to an embodiment of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include circuit structures and a method for detecting and correcting offset within optical and opto-electronic circuits. The circuit structure may include a first amplifier stage having an input; a second amplifier stage connected to the first amplifier stage, the second amplifier stage having an output, wherein the first amplifier stage and the second amplifier stage carry a signal; a controller configured to measure and modify at least one operational parameter of the signal, the controller including: a first controller input, a first controller output connecting the controller to the input; and a second controller input; a first offset polarity detector-low pass filter (OPD-LPF) circuit connecting the second amplifier stage output to the controller through the first controller input; and a second OPD-LPF circuit connecting the second amplifier stage to the controller through the second controller input; wherein the controller measures the at least one operational parameter of the signal for offset based on input from the first OPD-LPF circuit and the second OPD-LPF circuit, and wherein the controller modifies the at least one operational parameter of the signal to correct signal offset through the first controller output. By measuring the signal within the circuit structure, the controller may modify a signal therein to reduce offset. The circuit structure increases flexibility and reconfigurability in structuring circuits for offset detection and correction circuitry. The circuit structure also increases reusability of the offset detection and correction circuitry independent of the specific technology implemented in each circuit structure. The circuit structure also reduces an area required for offset detection and correction circuitry.

As used herein, references to a "signal" or "signals" means any conceivable medium of transmitting information and any associated physical values, such as voltage or current. Signals may also include any waveform, such as, for example, analog, digital, continuous, periodic, deterministic, or random signals. Signals may further include current or voltage waveforms as a function of time or any other variable.

As used herein, "offset" or "signal offset" mean any difference between an ideal (i.e., theoretical) signal or value and the measured (i.e., non-ideal) signal or value in practice. Signal offset may include, for example, voltage or current differences between an ideal value and a measured value in a physical circuit. Offset may be caused by, for example, physical differences in electronic components introduced during their fabrication that make them non-ideal, i.e., function differently than they theoretically should.

As used herein, signal "compensation" or "correction" refer to any action or actions to bring a signal or value closer to its ideal signal or value.

As used herein, "modify," when referring to a signal, means any change to the signal, including, for example, increasing the signal's current or voltage, changing a signal's waveform, or changing a signal's amplitude or frequency.

As used herein, "operational parameter" or simply "parameter" refer to any attribute or characteristic of a signal, such as irradiance, amplitude, magnitude, phase, frequency, duration, shape, polarization, modulation, and/or level.

FIG. 1A shows a schematic view of a circuit structure 100 according to embodiments of the disclosure. Circuit structure 100 may be an electronic or opto-electronic circuit that carries a signal from an input 106 to an output 108. To transmit information, that information is often transformed into a signal that a circuit may carry or further transform. However, due to variations in the components within circuit structure 100, signal offset can be introduced into the signal, thereby corrupting it. Therefore, circuit structure 100 may have a controller 124 configured to measure and modify operational parameters of a signal in circuit structure 100. Circuit structure 100 may be a complete circuit or may be part of a larger circuit. Circuit structure 100 may be a circuit carrying any conceivable signal. In one embodiment, circuit structure 100 may take the form of a silicon photonic receiver circuit. Silicon photonic receiver circuits generally convert optical signals to electronic signal through optical-to-electric (O/E) conversion. That is, the optical signal input to a silicon photonic receiver circuit may be any signal in the electromagnetic spectrum, including, for example, waves in the RF band.

Still referring to FIG. 1A, circuit structure 100 may include first amplifier stage 102 and second amplifier stage 104. Amplifier stages 102, 104 are circuits that include at least one amplifier and are generally electronic devices that increase the power of a signal within the circuit. Electronic amplifiers increase signal power by, for example, increasing the amplitude of a signal. However, due to variations introduced during manufacturing, amplifiers may inject noise or offset into a signal carried in circuit structure 100, requiring correction. Thus, in practice, as a signal is carried through first amplifier stage 102 or second amplifier stage 104, the signal may be corrupted by offset, necessitating correction. This may result in the signal being different depending on where within circuit structure 100 an operational parameter of the signal is measured. For example, measuring an operational parameter within first amplifier stage 102 may yield a different result than measuring the operational parameter in second amplifier stage 104. As noted, an amplifier stage generally includes at least one amplifier circuit, but may include multiple amplifier circuits within the same stage. That is, an amplifier stage may include multiple individual amplifier stages which further include other electronic components, such as transistors, resistors, capacitors, etc. Depending on function, different amplifier stages may be combined to create a single amplifier stage. In practice, it is often desirable to have multiple stages within a single circuit to achieve the desired signal or signal amplification. As understood in the art, a single stage amplifier may include one active device, e.g., one operational amplifier. A multistage amplifier may include multiple single stages electrically coupled together by a coupling device. Coupling devices may include any conceivable coupling device, including, for example, capacitors or transformers. When multiple single stages are coupled, the circuit may be referenced as "cascading."

First amplifier stage 102 of circuit structure 100 may have an input 106 carry an input signal into first amplifier stage 102, the signal requiring offset detection and correction. Due to variations introduced during manufacturing, input 106 may inject noise or cause offset in a signal carried in circuit structure 100. Input 106 may be any conceivable current or future electronic component or device that can carry a signal into circuit structure 100, including, for example, inputs from other circuits, sensors, diodes, etc. In one embodiment, input 106 may include photodiode (not shown). Circuit structure 100 may include amplifiers 114, 116, 118 which may include or take the form of, for example, any conceivable amplifier; transimpedance amplifiers (TIA); single-end-to-differential amplifiers; limiting amplifiers (LA); linear amplifiers; radio frequency (RF) amplifiers; impedance-matched buffer amplifiers; opto-isolators; and resistive buffers. A TIA converts current to voltage in a circuit. Limiting amplifiers are a class of amplifier components that have a limited maximum output for signal preservation. A linear amplifier is a component with an output signal that is proportional to the input signal. RF amplifiers amplify signals in the RF spectrum. An impedance-matched buffer amplifier matches input and output impedances in circuits. An opto-isolator couples electronic components, transferring the signal from one component to the next using light. A resistive buffer protects a signal from load currents and voltages. Additionally, one skilled in the art will appreciate that amplifiers 114, 116, 118 may optionally include any conceivable circuit component, such as resistors, capacitors, diodes, inductors, transistors, logic gates, multiplexers, etc., that are omitted from the figures for clarity.

In one embodiment, first amplifier stage 102 may include or take the form of a single-ended circuit 120 and second amplifier stage 104 may include or take the form of a differential circuit 122. Single-ended signaling is, generally, a method of transmitting information over a single wire. Single-ended circuit 120 may carry, for example, current or voltage. Differential signaling is, generally, a method of transmitting information over at least two wires. Differential circuit 122 may carry, for example, current or voltage. In another embodiment, amplifier 114 may take the form of a transimpedance amplifier and amplifier 116 may take the form of a single-ended-to-differential amplifier 116, wherein amplifier 114 is connected to amplifier 116 in the second amplifier stage. Amplifier 116 may be further connected to amplifier 118, which may be a limiting amplifier. In yet another embodiment, amplifiers 114, 116, 118 may be comprised of other amplifier stages (omitted for clarity) which may include or take the form of any of a transimpedance amplifier; a single-end-to-differential amplifier; a limiting amplifier; a linear amplifier; a radio frequency amplifier; an impedance-matched buffer amplifier; or a resistive buffer.

Still referring to FIG. 1A, circuit structure 100 may also include a first offset-polarity detector-low-pass filter (OPD-LPF) circuit 110 and a second OPD-LPF circuit 112. OPD-LPF circuits 110, 112 are configured to sample operational parameters of a signal and feed those values to controller 124 to detect offset therein. First OPD-LPF circuit 110 and second OPD-LPF circuit 112 connect circuit structure 100 to controller 124 through a first controller input 128 and a second controller input 130, respectively. First OPD-LPF circuit 110 may be connected to an output 108 of second amplifier stage 104. Structurally, first OPD-LPF circuit 110 and second OPD-LPF circuit 112 may include any number of low-pass filters 132. Thus, the term "offset-polarity detector-low-pass filter circuit" is intended only to identify the component described throughout this application and is intended to be non-limiting. For clarity, the combination of first OPD-LPF circuit 110 and low-pass filter(s) 132 are illustrated in box 134. Low-pass filter(s) 132 are a known component in the art and are used to omit undesired high frequencies from an electric signal. OPD-LPF circuits 110, 112 may include any number other electronic components necessary for their function.

In one embodiment, circuit structure 100 may include a plurality of additional OPD-LPF circuits 152 (illustrated as stacked triangles) depending on circuit size, function, etc. Each OPD-LPF circuit will have a distinct connection to circuit structure 100. That is, no two OPD-LPF circuits will be electrically connected to the same point in circuit structure 100. Plurality of additional OPD-LPF circuits 152 provides the advantage of providing offset detection at multiple points in circuit structure 100. In another embodiment, OPL-LPF circuits 110, 112 may carry the common mode voltage of the signal to controller 124 through terminals 136, 138 and the DC voltage of terminal 138 within circuit structure 100. A common mode voltage measurement is known in the art and is generally understood as the average voltage of two differential signals and a reference voltage. Common mode voltage measurements may be, for example, constant or a function of time. Common mode voltage measurement configurations are denoted by an oval around terminals 136, 138.

Still referring to FIG. 1A, circuit structure 100 may include controller 124. As mentioned previously, controller 124 may be configured to measure operational parameters of a signal passed from circuit structure 100 through OPD-LPF circuits 110, 112. Based on input from OPD-LPF circuits 110, 112, controller 124 will register a measurement of positive (+), negative (−), or zero (0). That is, controller 124 detects offset within circuit structure 100 based on measured operational parameters of the signal passed to it from OPD-LPF circuits 110, 112. A user (not shown) may program controller 124 to include a set of criteria that controller 124 compares the measured signal against. That is, controller 124 may detect offset by comparing operational parameters measured from circuit structure 100 (e.g., signals, voltage, or current) to pre-determined control values to determine the appropriate corrective action, if any, in the signal. A measurement of positive or negative indicates the polarity of signal offset, thereby confirming offset exists in circuit structure 100. A measurement of zero, on the other hand, indicates offset is either absent or below a detectable threshold, i.e., the circuit carries the desired signal. Controller 124 may detect signal offset, and then compensate any detectable offset by modifying the signal within circuit structure 100. For example, controller 124 may optionally increase or decrease the current or voltage in circuit structure 100. By increasing or decreasing the current or voltage in circuit structure 100, controller 124 corrects offset in circuit structure 100. Of course, controller 124 may optionally take no corrective action if no offset is detected within circuit structure 100. Controller 124 includes first controller output 140 that connects controller 124 to modify an operational parameter of a signal carried by circuit structure 100. Depending on the type of circuit or demands of the user, controller 124 may have a plurality of controller inputs (not shown) for increasingly accurate measurements of operational parameters of a signal. Controller 124 may be any conceivable electronic control unit, including, for example, embedded systems or microcontrollers. Thus, while controller 124 is illustrated as a block throughout the figures for simplicity, one skilled in the art will appreciate that controller 124 may include as many subcomponents as necessary. Moreover, circuit structure 100 may include any number of controllers as necessary to measure and correct signal offset. In one embodiment, controller 124 may include a second controller output 142 connected to the second amplifier stage.

Figure 1B:
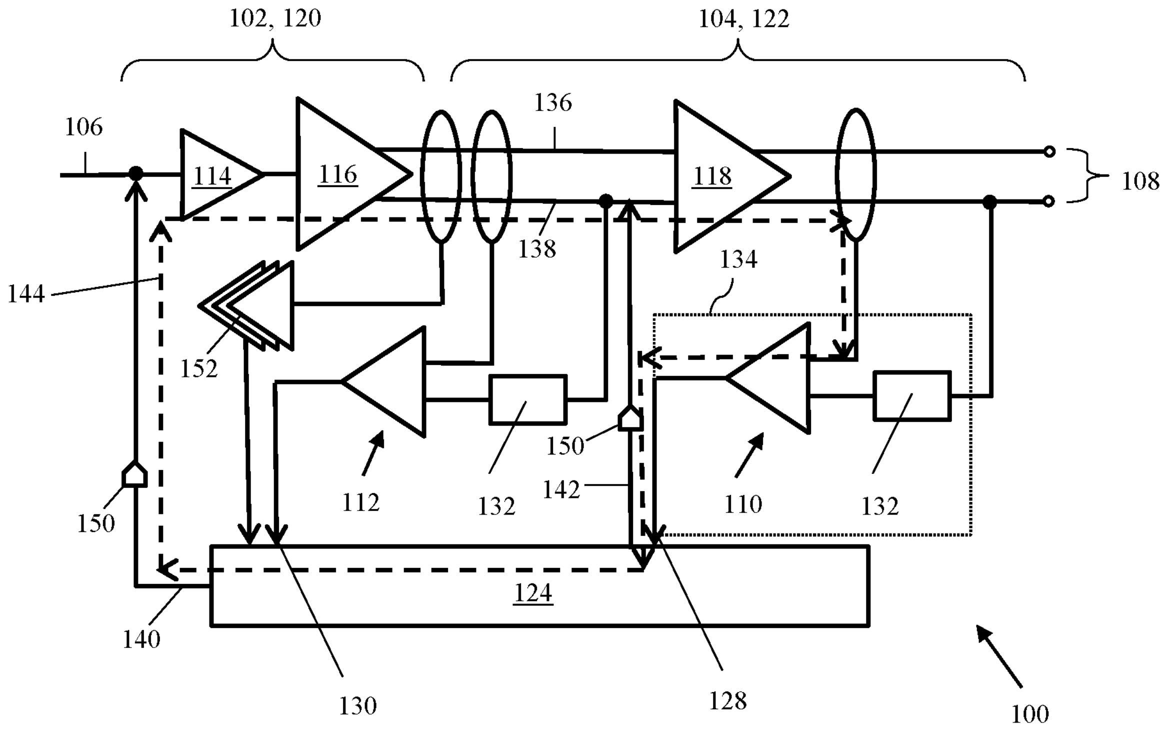
FIG. 1B shows a schematic view of the circuit structure of FIG. 1 highlighting a first feedback loop.
Figure 1C:
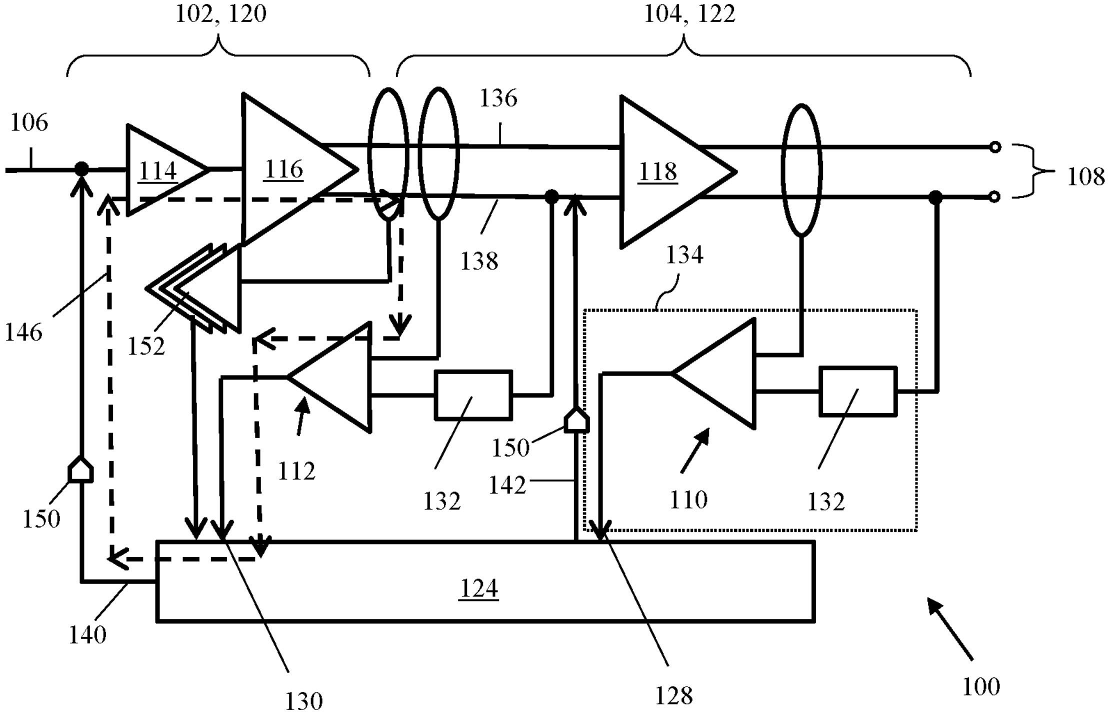
FIG. 1C shows a schematic view of the circuit structure of FIG. 1 highlighting a second feedback loop.
Figure 1D:
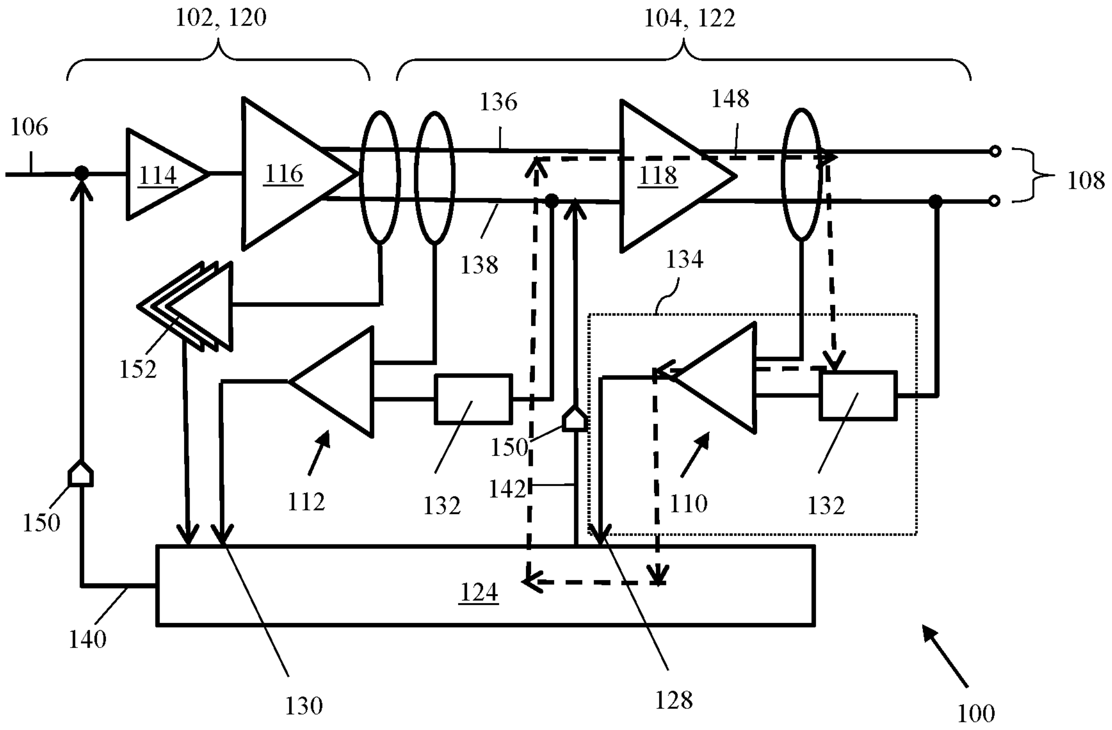
FIG. 1D shows a schematic view of the circuit structure of FIG. 1 highlighting a third feedback loop.

Referring now to FIGS. 1B, 1C, and 1D, schematic views of a circuit structure 100 according to embodiments of the disclosure with a first feedback loop 144 (FIG. 1B) and a second feedback loop 146 (FIG. 1C) are shown. Feedback loops are, generally, architectures within a circuit where an output (or portion thereof) of a circuit is used as an input within the same circuit. Specifically, circuit structure 100 may include a first feedback loop 144 and a second feedback loop 146. Feedback loops 144, 146 are illustrated solely as a visual guide to show a directional view of how signal offset detection and correction within circuit structure 100 occurs. First feedback loop 144 (FIG. 1B) may include first OPD-LPF circuit 110, first controller input 128, controller 124, and a first controller output 140. Second feedback loop 146 (FIG. 1C) may include second OPD-LPF circuit 112, second controller input 130, controller 124, and first controller output 140. As shown in FIG. 1D, in some embodiments, circuit structure 100 may include a third feedback loop 148 which may include first OPD-LPF circuit 110, first controller input 128, controller 124, and a second controller output 142. In another embodiment, as shown in FIGS. 1A-D, first controller output 140 and second controller output 142 may include digital-to-analog converters (DACs) 150. While only two feedback loops are illustrated in FIGS. 1B and 1C, circuit structure 100 may include any number of feedback loops.

Figure 2A:
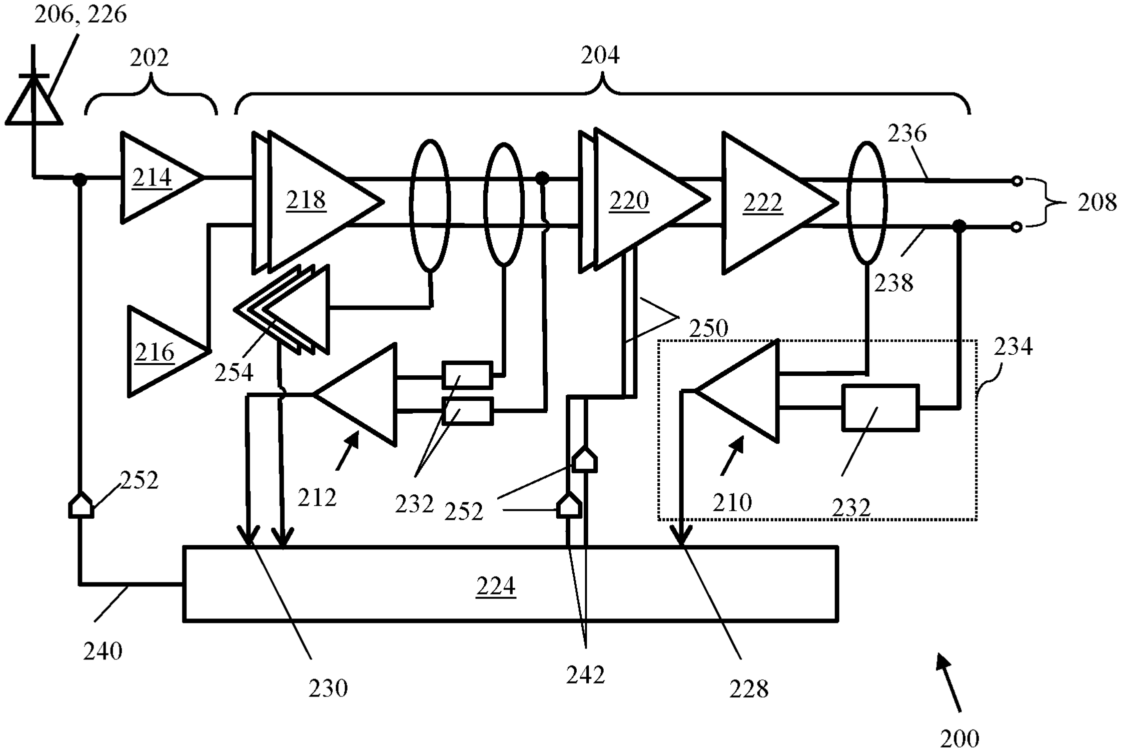
FIG. 2A shows a schematic view of a silicon photonic receiver circuit with offset detection and correction at two points, according to another embodiment of the disclosure.

Referring now to FIG. 2A, a schematic view of a silicon photonic receiver circuit 200 according to embodiments of the disclosure, is shown. Silicon photonic receiver circuits generally convert optical signals to electronic signal through optical-to-electric (O/E) conversion. Silicon photonic receiver circuit 200 may receive an input signal from photodiode 226. However, as mentioned previously, the input signal from photodiode 226 may experience offset due the non-idealities (e.g., undesired fabrication variations) in the photodiode 226 device. Silicon photonic receiver circuit 200 may therefore be configured to transmit an input signal with high fidelity, minimizing noise and offset.

Still referring to FIG. 2A, silicon photonic receiver circuit 200 may include single-ended amplifier stage 202 and a differential amplifier stage 204. Single-ended amplifier stage 202 and differential amplifier stage 204 may be substantially similar to first amplifier stage 102 and second amplifier stage 104 in FIG. 1A. That is, electronic amplifiers increase signal power by, for example, increasing the amplitude of a signal. However, due to variations introduced during manufacturing, amplifiers may inject noise or offset into a signal carried in silicon photonic receiver circuit 200, requiring correction. Thus, in practice, as a signal is carried through single-ended amplifier stage 202 or differential amplifier stage 204, the signal may be corrupted by offset, necessitating correction. Single-ended signaling is, generally, a method of transmitting information over a single wire. Single-ended amplifier stage 202 may carry, for example, current or voltage. Differential signaling is, generally, a method of transmitting information over at least two wires. Differential circuit 204 may carry, for example, current or voltage. An amplifier stage generally includes at least one amplifier circuit but may include multiple amplifier circuits within the same stage. That is, an operational amplifier stage may include multiple individual amplifier stages which further include other electronic components, such as transistors, resistors, capacitors, etc. Depending on function, different amplifier stages may be combined to create a single amplifier stage. In practice, it is often desirable to have multiple stages within a single circuit to achieve the desired signal or signal amplification. As understood in the art, a single stage amplifier may include one active device, e.g., one operational amplifier. A multistage amplifier may include multiple single stages electrically coupled together by a coupling device. Coupling devices may include any conceivable coupling device, including, for example, capacitors or transformers. When multiple single stages are coupled, the circuit may be known as "cascading." In one embodiment, differential amplifier stage 204 may include a single-ended-to-differential amplifier 218, wherein an output of a single-ended transimpedance amplifier (TIA) 214 within single-ended amplifier stage 204 is connected to an input of single-ended-to-differential amplifier 218. Additionally, transimpedance amplifier (TIA) dummy 216 is connected to an input of single-ended-to-differential amplifier 218. In another embodiment, differential amplifier stage 204 further includes amplifiers 220, 222, wherein amplifier 220 takes the form of a limiting amplifier and amplifier 222 takes the form of a resistive buffer. Alternatively, amplifiers 220, 222 may take the form of any amplifier circuit.

Still referring to FIG. 2A, silicon photonic receiver 200 may include an input 206, which may take the form of photodiode 226. Photodiode 226 may convert light into electrical current within silicon photonic receiver 200, thereby carrying an input signal into silicon photonic receiver 200. The incident optical signal on photodiode 226 may be any electromagnetic signal in the electromagnetic spectrum. The spectrum may include the full set of electromagnetic wavelengths, including, for example, radiofrequency (RF) waves, x-rays, and gamma rays. Photodiode 226 may convert electromagnetic energy, i.e., photons, in a given spectrum to electric current within silicon photonic receiver circuit 200. Photodiode 226 may be any conceivable current or future photodiode or device that can carry a signal into silicon photonic receiver circuit 200. As mentioned previously, the input signal from photodiode 226 may experience offset due to the non-ideality aspects (e.g., undesired fabrication variations) of photodiode 226. The offset thereby corrupts the input signal, requiring offset detection and correction. Photodiode 226 may be connected to a single-ended amplifier stage 202 of silicon photonic receiver circuit 200 and may carry an input signal into silicon photonic receiver circuit 200 requiring offset detection and correction.

Still referring to FIG. 2A, silicon photonic receiver circuit 200 may include a first offset-polarity detector-low-pass filter (OPD-LPF) circuit 210 and a second OPD-LPF circuit 212. OPD-LPF circuits 210, 212 may be substantially similar to those in FIG. 1A. That is, OPD-LPF circuits 210, 212 are configured to sample operational parameters of a signal and feed those values to controller 224 to detect offset therein. First OPD-LPF circuit 210 and second OPD-LPF circuit 212 connect silicon photonic receiver 200 to controller 224 through a first controller input 228 and a second controller input 230, respectively. First OPD-LPF circuit 210 may be connected to an output 208 of differential amplifier stage 204. Structurally, first OPD-LPF circuit 210 and second OPD-LPF circuit 212 may include any number of low-pass filters 232. Thus, the term "offset-polarity detector-low-pass filter circuit" is intended only to identify the component as described throughout this application and intended to be non-limiting. For clarity, the combination of first OPD-LPF circuit 210 and low-pass filter(s) 232 are illustrated in box 234. Low-pass filter(s) 232 are a known component in the art and are used to omit undesired high frequencies from an electric signal. OPD-LPF circuits 210, 212 may include any number other electronic components necessary for their function. In one embodiment, silicon photonic receiver circuit 200 may include a plurality of additional OPD-LPF circuits 254 depending on circuit size, function, etc. Each OPD-LPF circuit will have a distinct connection to silicon photonic receiver circuit 200. That is, no two OPD-LPF circuits will be electrically connected to the same point in silicon photonic receiver circuit 200. Plurality of additional OPD-LPF circuits 254 provides the advantage of providing offset detection at multiple points in silicon photonic receiver circuit 200. In another embodiment, OPL-LPF circuits 210, 212 may carry the common mode voltage of the signal to controller 224 through terminals 236, 238 and the DC voltage of terminal 238 within silicon photonic receiver circuit 200. A common mode voltage measurement is known in the art and is generally understood as the average voltage of two differential signals and a reference voltage. Common mode voltage measurements may be, for example, constant or a function of time. Common mode voltage measurement configurations are denoted by an oval around terminals 236, 238.

Still referring to FIG. 2A, silicon photonic receiver circuit 200 may include controller 224. Controller 224 may be substantially similar to controller 124 in FIG. 1A. That is, controller 224 may be configured to measure operational parameters of a signal passed from silicon photonic receiver circuit 200 through OPD-LPF circuits 210, 212. Based on input from OPD-LPF circuits 210, 212, controller 224 will register a measurement of positive (+), negative (−), or zero (0). That is, controller 224 detects offset within silicon photonic receiver circuit 200 based on measured operational parameters of the signal passed to it from OPD-LPF circuits 210, 212 through controller inputs 228 and 230. A user (not shown) may program controller 224 to include a set of criteria that controller 224 compares the measured signal against. That is, controller 224 may detect offset by comparing operational parameters measured from silicon photonic receiver circuit 200 (e.g., signals, voltage, or current) to pre-determined control values to determine the appropriate corrective action, if any, in the signal. A measurement of positive or negative indicates the polarity of signal offset, thereby confirming offset exists in silicon photonic receiver circuit 200. A measurement of zero, on the other hand, indicates offset is either absent or below a detectable threshold, i.e., the circuit carries the desired signal. Controller 224 may detect signal offset, and then compensate any detectable offset by modifying the signal within silicon photonic receiver circuit 200. For example, controller 224 may optionally increase or decrease the current or voltage in silicon photonic receiver circuit 200. By increasing or decreasing the current or voltage within silicon photonic receiver circuit 200, controller 224 corrects offset in therein. Of course, controller 224 may optionally take no corrective action if no offset is detected within silicon photonic receiver circuit 200. Controller 224 includes first controller output 240 that connects controller 224 to silicon photonic receiver circuit 200, allowing controller 224 to modify the signal therein. Depending on the type of circuit or demands of the user, controller 224 may have a plurality of controller inputs (not shown) for increasingly accurate measurements of operational parameters of a signal. Controller 224 may be any conceivable electronic control unit, including, for example, embedded systems or microcontrollers. Thus, while controller 224 is illustrated as a block throughout the figures for simplicity, one skilled in the art will appreciate that controller 224 may include as many subcomponents as necessary. Moreover, silicon photonic receiver circuit 200. May include any number of controllers as necessary to measure and correct signal offset. In one embodiment, controller 224 may include a second controller output 242.

Figure 2B:
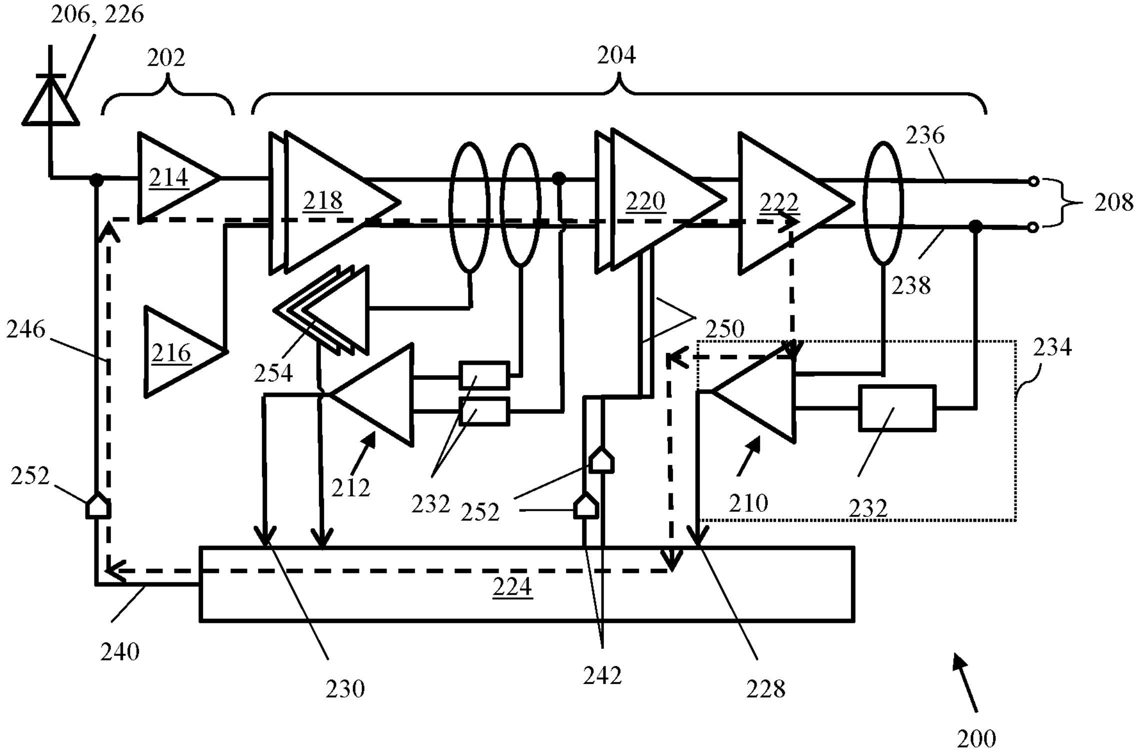
FIG. 2B shows a schematic view of the silicon photonic receiver circuit of FIG. 2A highlighting a first feedback loop.
Figure 2C:
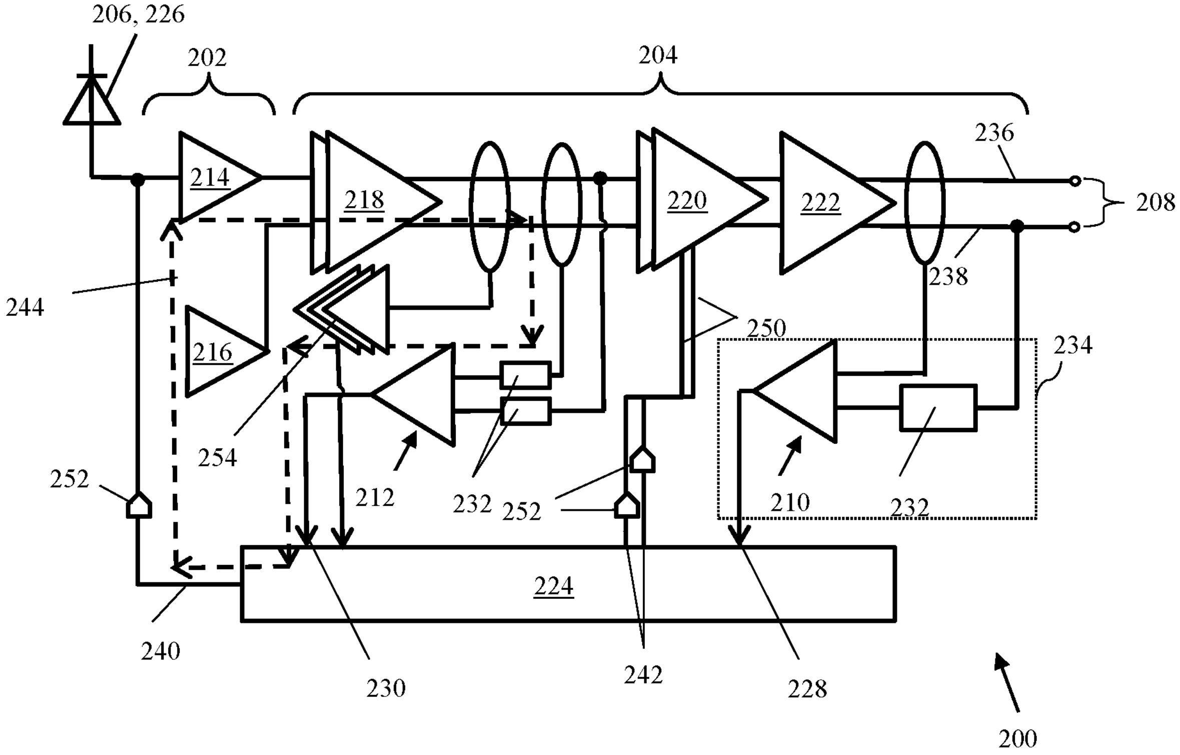
FIG. 2C shows a schematic view of the silicon photonic receiver circuit of FIG. 2A highlighting a second feedback loop.
Figure 2D:
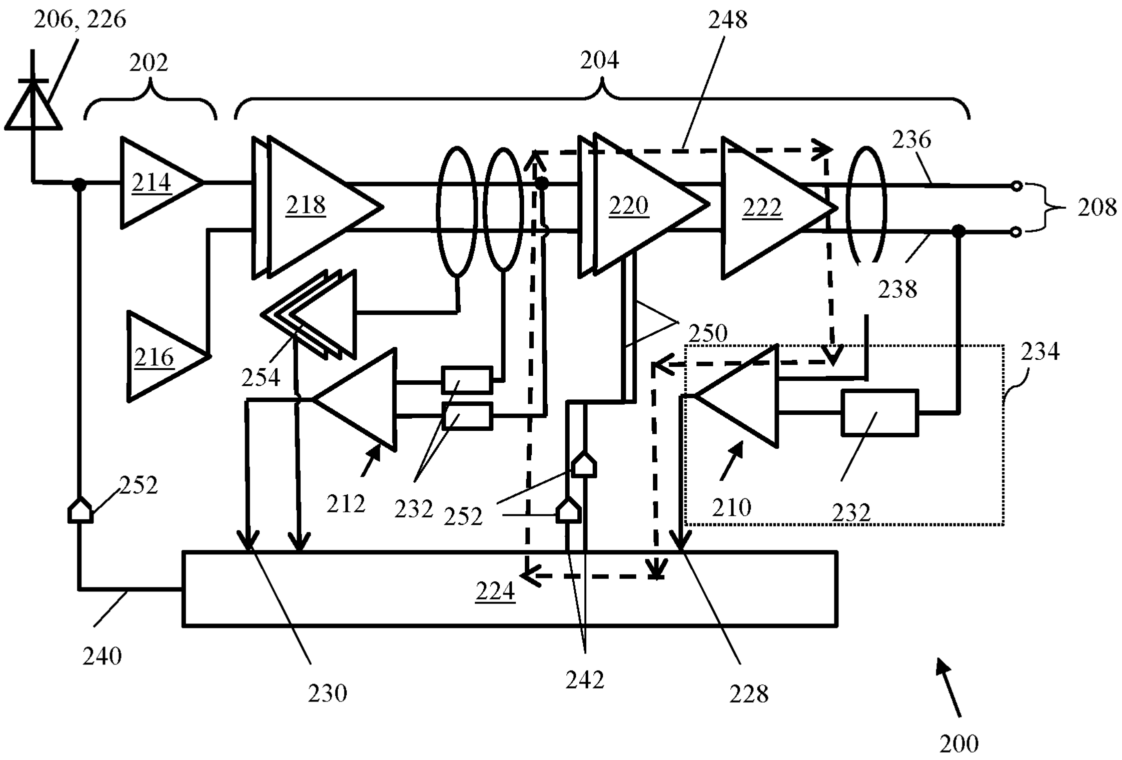
FIG. 2D shows a schematic view of the silicon photonic receiver circuit of FIG. 2A highlighting a third feedback loop.

Referring now to FIGS. 2B, 2C, and 2D, schematic views of a silicon photonic receiver circuit 200 according to embodiments of the disclosure, are shown. Because silicon photonic receiver circuit 200 includes first and second OPD-LPF circuits 210, 212 and controller 224, it may include feedback loops substantially similar to first feedback loop 144 (FIG. 1B), second feedback loop 146 (FIG. 1C), and third feedback loop 148 (FIG. 1D). That is, silicon photonic receiver circuit 200 may include first feedback loop 244 (FIG. 2B), second feedback loop 246 (FIG. 2C), and third feedback loop 248 (FIG. 2D). Feedback loops are, generally, architectures within a circuit where an output (or portion thereof) of a circuit is used as an input within the same circuit. The feedback loops 244, 246, 248 is illustrated solely as a visual guide to show a directional view of how signal offset detection and correction within silicon photonic receiver circuit 200. First feedback loop 244 (FIG. 2B) may include first OPD-LPF circuit 210, first controller input 228, controller 224, and a first controller output 240. Second feedback loop 246 (FIG. 2C) may include second OPD-LPF circuit 212, second controller input 230, controller 224, and first controller output 240. Third feedback loop 248 may include first OPD-LPF circuit 210, first controller input 240, controller 224, and second controller output 242. In one embodiment, third feedback loop 248 may further include at least two wires 250 (FIGS. 2A and 2B). In another embodiment, second controller output 242 may include two digital-to-analog converters 252. While only one feedback loop is illustrated, silicon photonic receiver circuit 200 may include any number of feedback loops.

Figure 3:
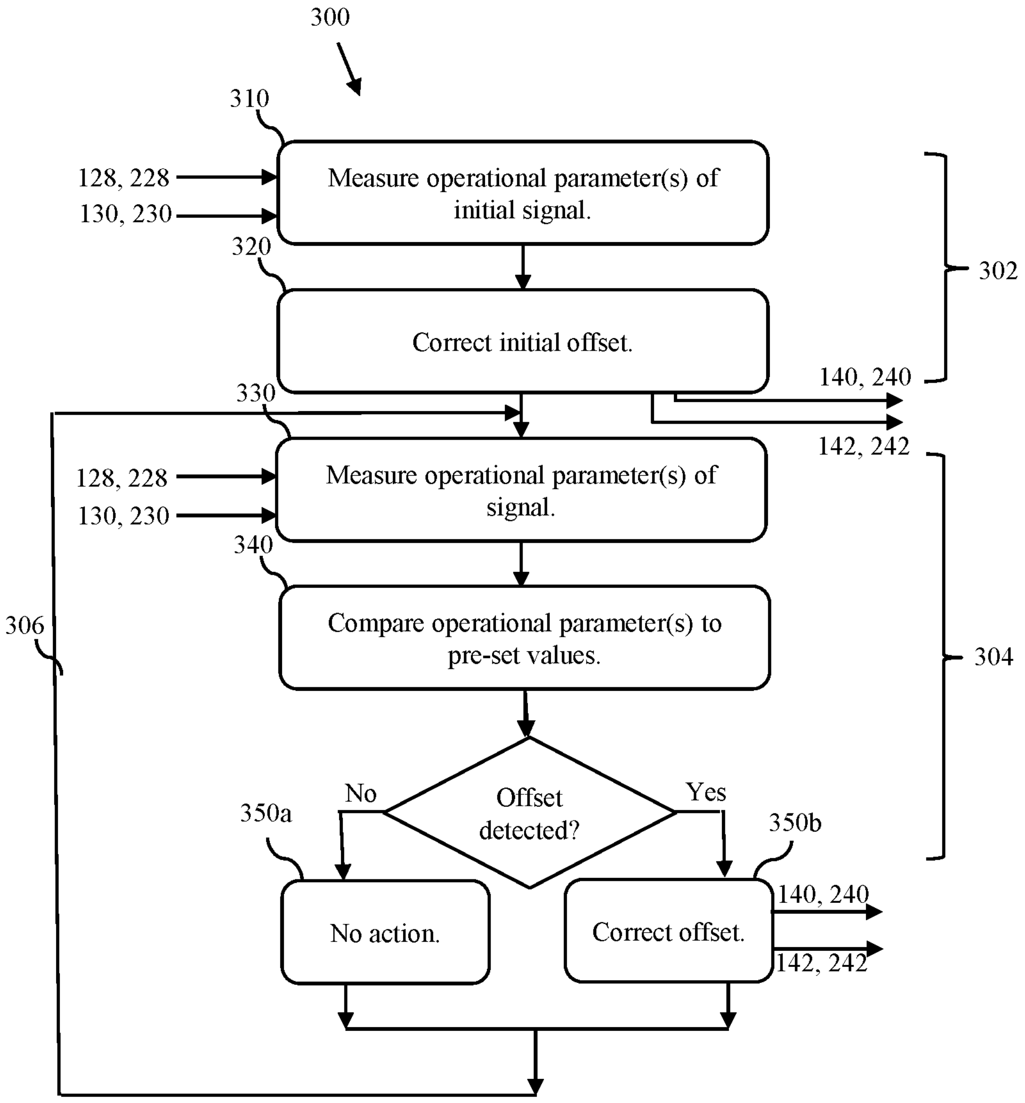
FIG. 3 shows a flow diagram of a method for correcting offset in a circuit according to embodiments of the disclosure.

FIG. 3 shows a process flow chart for method 300 for detecting and correcting signal offset in circuit structure 100 (FIG. 1A) or silicon photonic receiver circuit 200 (FIG. 2A), which may include some or all of the components described above. With reference to FIGS. 1A-D, 2A-D and 3, method 300 includes calibrating a signal in circuit structure 100, silicon photonic receiver circuit 200 through controllers 124, 224 measuring an operational parameter or operational parameters of a signal, correcting any detected offset, and tracking the operational parameter(s) of the signal thereafter. Method 300 may include calibration phase 302 and tracking phase 304.

Still referring to FIG. 3, calibration phase 302 may include initial measurement step 310 wherein controllers 124, 224 measures the signal within circuit structure 100, silicon photonic receiver circuit 200 through first OPD-LPF circuits 110, 210 and through second OPD-LPF circuits 112, 212. After initially receiving a signal at input 106, photodiode 226 or powering on circuit structure 100, silicon photonic receiver circuit 200, the offset will be greater than during continuous operation and will require calibration. Calibration phase 302 may include reducing offset in circuit structure 100, silicon photonic receiver circuit 200 through initial measurement step 310 and initial correction step 320.

Still referring to FIG. 3, initial measurement step 310 may include controllers 124, 224 measuring operational parameters of the signal within circuit structure 100, silicon photonic receiver circuit 200. As mentioned previously, initial measurement step 310 is expected to measure higher offset values than after initial correction step 320 removes the bulk of the initial offset. Once offset is detected in initial measurement step 310, the process moves to initial correction step 320.

Still referring to FIG. 3, calibration phase 302 may further include initial correction step 320, wherein controllers 124, 224 correct the initial offset within circuit structure 100, silicon photonic receiver circuit 200 at a given point therein through feedback loops. Initial correction step 320 substantially removes detected offset within circuit structure 100, silicon photonic receiver circuit 200 by modifying an operational parameter or operational parameters of the signal within circuit structure 100, silicon photonic receiver circuit 200 to achieve desired, pre-set operational parameter values. As mentioned previously, controllers 124, 224 may have to correct a large offset during initial correction step 320. Thereafter, the offset is expected to be less than it was initially.

Method 300 may include tracking phase 304 to track the signal within circuit structure 100, silicon photonic receiver circuit 200 and maintain minimal offset levels. Method 300 may include measurement step 330, measurement comparison step 340, no action step 350*a*, and corrective action step 350*b*, which are discussed in detail below.

Still referring to FIG. 3, tracking phase 304 may include measurement step 330 which tracks signal offset within circuit structure 100, silicon photonic receiver circuit 200 through controllers 124, 224 tracking the signal in circuit structure 100, silicon photonic receiver circuit 200 by measuring operational parameters of the signal therein. That is, OPD-LPF circuits 110, 112, 210, 212 pass operational parameter values to controller 124, 224 which in turn compares the values to pre-set operational parameter values. Controllers 124, 224 may measure at least two points in circuit structure 100, silicon photonic receiver circuit 200 through first OPD-LPF circuits 110, 210 and second OPD-LPF circuits 112, 212. Measurement step 330 may include continuous or discontinuous (i.e., periodic) measurements by sampling the signal within circuit structure 100, silicon photonic receiver circuit 200. When continuously sampling, one skilled in the art will appreciate that controllers 124, 224 sample the signal with essentially infinitesimally small increments between samples. When discontinuous, controllers 124, 224 periodically sample the signal within circuit structure 100, silicon photonic receiver circuit 200. Sampling periods can be, for example, anywhere from 1 microsecond to several hours.

Still referring to FIG. 3, tracking phase 304 may include measurement comparison step. Measurement comparison step 340 may include controllers 124, 224 comparing measured operational parameter values to pre-set values to determine what, if any, corrective action is required to correct offset within circuit structure 100, silicon photonic receiver circuit 200. Upon comparing measured values against pre-set values, controllers 124, 224 may optionally choose no action step 350*a* or corrective action step 350*b*. In no action step 350*a*, controllers 124, 224 does not increase or decrease the current or voltage in circuit structure 100, silicon photonic receiver circuit 200 because measured offset is below a detectable threshold or is within tolerances. In any event, the controllers 124, 224 pursue no action step 350*a* when offset within circuit structure 100, silicon photonic receiver circuit 200 needs no correction. Alternatively, controllers 124, 224 may pursue corrective action step 350*a* after detecting offset within circuit structure 100, silicon photonic receiver circuit 200. Corrective action step 350*b* may include controllers 124, 224 modifying operational parameters of the signal, including, for example, increasing or decreasing current or voltage within circuit structure 100, silicon photonic receiver circuit 200, thereby modifying the signal waveform by removing offset. Finally, after controllers 124, 224 either engage no action step 350*a* or corrective action step 350*b*, the method repeats loop 306 by repeating measurement step 330, measurement comparison step 340, and either no action step 350*a* or corrective action step 350*b* as necessary.

The method and structure as described above are used in the fabrication and operation of photonic integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof. “Optional” or “optionally” means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as “about”, “approximately” and “substantially”, are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A circuit structure, comprising:

a first differential amplifier stage having an input;

a second differential amplifier stage connected to the first differential amplifier stage, the second differential amplifier stage having an output, wherein the first differential amplifier stage and the second differential amplifier stage carry a signal;

a controller configured to measure and modify at least one operational parameter of the signal, the controller including:

a first controller input, a first controller output connecting the controller to the input;

a second controller input; and a second controller output connecting the controller to the second differential amplifier stage;

a first offset polarity detector and low-pass filter circuit connecting a differential mode volage signal of the second differential amplifier stage and a first common-mode voltage signal based on differential signal output from the second differential amplifier stage to the controller through the first controller input, wherein the first offset polarity detector and low-pass filter circuit includes at least one first low-pass filter; and a second offset polarity detector and low-pass filter circuit connecting a differential mode voltage signal of the first differential amplifier stage and a second common-mode voltage signal based on differential signal output from the first differential amplifier stage to the controller through the second controller input, wherein the second offset polarity detector and low-pass filter circuit includes at least one second low-pass filter;

wherein the controller measures the at least one operational parameter of the signal for offset based on input from the first offset polarity detector and low-pass filter circuit and the second offset polarity detector and low-pass filter circuit, and wherein the controller modifies the at least one operational parameter of the signal to correct signal offset through the first controller output and the second controller input, wherein the circuit structure further includes a first feedback loop, a second feedback loop, and a third feedback loop, wherein the first feedback loop includes the first offset polarity detector and low-pass filter circuit, the first controller input, the controller, and the first controller output, wherein the second feedback loop includes the second offset polarity detector and low-pass filter circuit, the second controller input, the controller, and the first controller output, and wherein the third feedback loop includes the first offset polarity detector and low-pass filter circuit, the first controller input, the controller, and the second controller output.

2. The circuit structure of claim 1, further including a plurality of additional offset polarity detector and low pass filter circuits, wherein each additional offset polarity detector and low-pass filter circuit in the plurality of additional offset polarity detector and low-pass filter circuits connects the controller to the second differential amplifier stage at different points within the second differential amplifier stage relative to each other.

3. The circuit structure of claim 2, wherein each additional offset polarity detector and low-pass filter circuit is connected to the second differential amplifier stage in a common mode configuration.

4. The circuit structure of claim 1, wherein the first differential amplifier stage further includes a single-ended circuit, and wherein the second differential amplifier stage includes a differential circuit.

5. The circuit structure of claim 1, wherein the first differential amplifier stage further includes a transimpedance amplifier connected to a single-ended-to-differential amplifier in the second differential amplifier stage, and wherein the single-ended-to-differential amplifier is connected to a limiting amplifier.

6. The circuit structure of claim 1, wherein the second controller output further includes a first connection and a second connection, wherein the first connection and the second connection connect the controller to the second differential amplifier stage.

7. The circuit structure of claim 6, wherein the first connection includes a first digital-to-analog converter (DAC) and the second connection includes a second DAC.

8. The circuit structure of claim 1, wherein the input of the first differential amplifier stage is a photodiode.

9. The circuit structure of claim 1, wherein the second differential amplifier stage includes any of a transimpedance amplifier (TIA); a single-end-to-differential amplifier; a limiting amplifier; a linear amplifier; a radio frequency (RF) amplifier; an impedance-matched buffer amplifier; and a resistive buffer.

10. A silicon photonic receiver circuit, comprising:

a first differential amplifier stage;

a photodiode configured to feed a signal to the first differential amplifier stage;

a second differential amplifier stage receiving an input from the first differential amplifier stage;

a controller configured to measure and modify at least one operational parameter of the signal, the controller including:

a first controller input, a second controller input, a first controller output connecting the controller to the input, and a second controller output connecting the controller to the second differential amplifier stage;

a first offset polarity detector and low-pass filter circuit connecting a differential mode voltage signal of the second differential amplifier stage and a first common-mode voltage signal based on differential signal output from the second differential amplifier stage to the controller through the first controller input; and a second offset polarity detector and low-pass filter circuit connecting a differential mode voltage signal of the first differential amplifier stage and a second common-mode voltage signal based on the differential signal output from the first differential amplifier to the controller through the second controller input;

wherein the controller measures the at least one operational parameter of the signal for offset based on input from the first offset polarity detector and low-pass filter circuit and the second offset polarity detector and low-pass filter circuit, and wherein the controller modifies the at least one operational parameter of the signal to correct signal offset through the first controller output and the second controller input, wherein the silicon photonic receiver circuit includes a first feedback loop, a second feedback loop, and a third feedback loop, wherein the first feedback loop includes the first offset polarity detector and low-pass filter circuit, the first controller input, the controller, and the first controller output, wherein the second feedback loop includes the second offset polarity detector and low-pass filter circuit, the second controller input, the controller, and the first controller output, and wherein the third feedback loop includes the first offset polarity detector and low-pass filter circuit, the first controller input, the controller, and the second controller output.

11. The silicon photonic receiver circuit of claim 10, wherein the second differential amplifier stage further includes a single-ended-to-differential amplifier, wherein the first differential amplifier stage includes a single-ended transimpedance amplifier (TIA) having an output thereof connected to an input of the single-ended-to-differential amplifier.

12. The silicon photonic receiver circuit of claim 10, wherein the second differential amplifier stage further includes at least one of a limiting amplifier and a resistive buffer.

13. The silicon photonic receiver circuit of claim 12, further including a plurality of additional offset polarity detector and low pass filter circuits, wherein each additional offset polarity detector and low-pass filter circuit in the plurality of offset polarity detector and low-pass filter circuits connects the second differential amplifier stage to the controller at different points within the differential amplifier stage relative to each other offset polarity detector and low-pass filter circuit.

14. The silicon photonic receiver circuit of claim 13, wherein each additional offset polarity detector and low-pass filter circuit is connected to the second differential amplifier stage in a common mode configuration.

15. A method for correcting offset in a signal, the method comprising:

providing a circuit including:

a first differential amplifier stage having an input;

a second differential amplifier stage connected to the first differential amplifier stage, the second differential amplifier stage having an output, wherein the first differential amplifier stage and the second differential amplifier stage carry signal;

a controller configured to measure and modify at least one operational parameter of the signal, the controller including:

a first controller input, a first controller output connecting the controller to the input;

a second controller input; and a second controller output connecting the controller to the second differential amplifier stage;

a first offset polarity detector and low-pass filter circuit connecting a differential mode voltage signal of the second differential amplifier stage and a common-mode voltage signal based on differential signal output from the second differential amplifier stage to the controller through the first controller input, wherein the first offset polarity detector and low-pass filter circuit includes at least one first low-pass filter; and a second offset polarity detector and low-pass filter circuit connecting a differential mode voltage signal of the first differential amplifier stage and a common-mode voltage signal based on differential signal output from the first differential amplifier stage to the controller through the second controller input, wherein the second offset polarity detector and low-pass filter circuit includes at least one second low-pass filter;

wherein the controller measures the at least one operational parameter of the signal for offset based on input from the first offset polarity detector and low-pass filter circuit and the second offset polarity detector and low-pass filter circuit, and wherein the controller modifies the at least one operational parameter of the signal to correct signal offset through the first controller output through the first controller output and the second controller input, the circuit further includes a first feedback loop, a second feedback loop, and a third feedback loop, the first feedback loop includes the first offset polarity detector and low-pass filter circuit, the first controller input, the controller, and the first controller output, wherein the second feedback loop includes the second offset polarity detector and low-pass filter circuit, the second controller input, the controller, and the first controller output, and the third feedback loop includes the first offset polarity detector and low-pass filter circuit, the first controller input, the controller, and the second controller output;

calibrating signal carried by the provided circuit by:

measuring at least one operational parameter of the signal with the controller, and calibrating the signal with the controller by modifying the at least one operational parameter of the signal at the input of the circuit in the first feedback loop, the second feedback loop, and the third feedback loop; and tracking the signal by:

measuring the at least one operational parameter of the signal at the output of the circuit, the controller measuring the signal through the second offset polarity detector and low-pass filter circuit.

16. The method of claim 15, wherein tracking the signal further comprises:

comparing the at least one operational parameter of the signal to a pre-set value, and either:

taking no action, or modifying the at least one operational parameter of the signal at a point in the circuit in the second feedback loop.

17. The method of claim 16, wherein the controller continuously measures the at least one operational parameter of the signal in the circuit.

18. The method of claim 16, wherein the controller periodically measures the at least one operational parameter of the signal in the circuit.

19. The method of claim 16, further including measuring the at least one operational parameter of the signal at a plurality of connections in the circuit with the controller, the controller measuring the signal through a plurality of additional offset polarity detector and low-pass filter circuits connecting the controller to the plurality of connections in the circuit; and modifying the at least one operational parameter of the signal through the controller, the controller modifying the at least one operational parameter of the signal in a plurality of feedback loops, wherein the plurality of feedback loops connect the controller to a second plurality of connections in the circuit.

* * * * *